United States Patent [19]

Kashiwagi

[11] Patent Number: 5,271,146
[45] Date of Patent: Dec. 21, 1993

[54] ELECTRONIC COMPONENT SUPPLYING APPARATUS

[75] Inventor: Yasuhiro Kashiwagi, Fukuoka, Japan

[73] Assignee: Matsushita Electric Industrial Co., Ltd., Japan

[21] Appl. No.: 946,070

[22] Filed: Sep. 18, 1992

Related U.S. Application Data

[63] Continuation-in-part of Ser. No. 725,039, Jul. 3, 1991, abandoned.

[30] Foreign Application Priority Data

Jul. 6, 1990 [JP] Japan .................................. 2-180037

[51] Int. Cl.$^5$ ..................... H01R 43/00; B21D 37/12; B23P 23/00
[52] U.S. Cl. ..................................... 29/566.3; 29/827; 83/942; 140/105
[58] Field of Search .................. 29/566.2, 566.3, 564.4, 29/564.5, 564.6, 748, 747, 753, 827, 33 M, 564; 83/942, 622, 278, 279, 280, 157, 165, 112; 140/105

[56] References Cited

U.S. PATENT DOCUMENTS

| | | | |
|---|---|---|---|
| 3,232,158 | 2/1966 | Breeding | 83/942 X |
| 4,409,733 | 10/1983 | Alemanni | 29/564.3 X |
| 4,885,837 | 12/1989 | Eshima et al. | 29/564 |
| 4,941,248 | 7/1990 | Seidel et al. | 29/564.6 |
| 4,945,954 | 8/1990 | Wehrly, Jr. et al. | 140/105 |
| 4,957,146 | 9/1990 | Satterfield et al. | 140/105 |
| 5,070,916 | 12/1991 | Biesecker | 29/827 |

FOREIGN PATENT DOCUMENTS

| | | | |
|---|---|---|---|
| 101266 | 9/1979 | Japan | 29/33 M |
| 222550 | 12/1983 | Japan | 29/827 |
| 752840 | 8/1980 | U.S.S.R. | 29/566.3 |
| 1103928 | 7/1984 | U.S.S.R. | 29/33 M |

*Primary Examiner*—William Briggs
*Attorney, Agent, or Firm*—Lowe, Price, LeBlanc & Becker

[57] ABSTRACT

An apparatus for supplying an electronic component to a mounting head of an electronic component mounting machine in such a manner that a lead guard interconnecting the front ends of leads of the electronic component is separated from a body of the electronic component before the electronic component is picked up by the mounting head. The apparatus includes a lower mold movable between a receiving position in which an electronic component having a lead guard is received on a die on the lower mold, a punching position in which the lead guard is separated from the body of the electronic component by a punch cooperating with the die and a picking-up position in which the electronic component devoid of the lead guard is picked up from the die. The electronic component supplied from a chute to a component rest is delivered by a transfer unit to the die while at rest in the receiving position. The transfer unit may include a vacuum nozzle for releasably holding the electronic component. The lower mold is moved preferably by a motor-driven ball screw.

22 Claims, 5 Drawing Sheets

ELECTRONIC COMPONENT SUPPLYING APPARATUS

This application is a continuation-in-part of U.S. Ser. No. 07/725,039, filed Jul. 3, 1991, abandoned.

BACKGROUND OF THE INVENTION

1. Field of the Invention

The present invention relates generally to an electronic component supplying apparatus, and more particularly, to an apparatus for supplying an electronic component having a lead guard to a transfer head of an electronic component mounting machine.

2. Description of the Prior Art

As shown in FIG. 4, there has been proposed an electronic component 100 of the type having a frame-shaped lead guard 103 formed at the front ends of the respective leads 102 extending from a body 101 of the electronic component 100, so as to protect the leads 102 against damage.

The lead guard 103 thus provided is advantageous in that the leads 102 of the electronic component 100 are prevented from being bent or otherwise deformed due to contact or interference with an obstacle during stacking or transportation of the electronic component 100. However, the lead guard 103 must be removed by cutting, for example, when the electronic component 100 is mounted on a circuit board.

There has been no concrete means proposed so far for mounting such an electronic component 100 having the above-described lead guard 103 on a circuit board.

SUMMARY OF THE INVENTION

It is, therefore, an object of the present invention to provide an apparatus for supplying an electronic component having a lead guard to a mounting head of an electronic component mounting machine in such a condition that before the electronic component is picked up by the mounting head, the lead guard is separated from a body of the electronic component.

An electronic component supplying apparatus of the present invention comprises an inclined chute having a longitudinal guide track in and along which an electronic component having a lead guard interconnecting the front ends of the respective leads slides downwardly. A component rest is disposed at a lower end of the chute for receiving and temporarily holding the electronic component discharged from the chute. The apparatus further includes a lower mold having a die, and means for moving the lower mold successively between a receiving position in which the electronic component held on the component rest is received on the die of the lower mold, a punching position in which the leads of the electronic component received on the die are severed to separate the lead guard from a body of the electronic component, and a picking-up position in which the electronic component devoid of the lead guard is picked up from the die by means of a mounting head of an electronic component mounting machine. Means is provided for transferring the electronic component from the component rest onto the die while the lower mold is at rest in the receiving position. An upper mold is disposed above the punching position and has a punch cooperating with the die to sever the leads of the electronic component. The upper mold is vertically movable toward and away said lower mold while at rest in the punching position so that the punch and the die cooperate with each other to sever the leads of the electronic component. The apparatus further includes means for reciprocating the upper mold relative to the lower mold.

Preferably, the moving means comprises a motor-driven ball screw which includes a horizontal screw shaft rotatably mounted on a frame of the apparatus, a motor attached to the frame and coupled to the screw shaft for rotating the screw shaft, and a nut threaded over the screw shaft and movable along the screw shaft in response to rotation of the screw shaft. The nut is connected with the lower mold.

The transferring means may include a transfer head movable between a taking-up position located above the component rest and a releasing position located above the receiving position, a vacuum nozzle associated with the transfer head for releasably holding the electronic component by the action of a suction force, means for moving the transfer head between the taking-up position and the releasing position, and means for vertically moving the vacuum nozzle when the transfer head is disposed in the taking-up position and the releasing position. The component rest may extend contiguously from a lower end of the inclined chute and incline at the same angle of inclination as the inclined chute. In this instance, when the transfer head is disposed in the taking-up position, the vacuum nozzle reciprocates along an axis perpendicular to a plane of the component rest for taking up the electronic component from the component rest, and when the transfer head is disposed in the releasing position, said vacuum nozzle reciprocates along an axis perpendicular to a plane of the die for setting the electronic component on the die of the lower mold while at rest in the receiving position.

The electronic component may be supplied directly to the die of the lower mold. In this instance, the lower mold is pivotally connected to the nut, and the transferring means is replaced by means for causing the lower mold to tilt at an angle same as an angle of inclination of the inclined chute at receiving position and also causing said lower mold to assume a horizontal condition at the punching position and the picking-up position. The causing means preferably comprises a plate cam mounted on the frame and having a cam surface, and a roller mounted on the lower mold and held in rolling engagement with the cam surface. The cam surface includes an inclined cam surface portion and a horizontal cam surface portion.

The receiving position and the punching position may be provided at the same position as a receiving-and-punching position in which instance the upper mold tilts at an angle same as said angle of inclination of the chute and is reciprocally movable along an axis extending perpendicular to a plane of the die of the lower mold disposed in the receiving-and-punching position.

The above and other objects, features and advantages of the present invention will become more apparent from the following description when making reference to the detailed description and the accompanying sheets of drawings in which preferred structural embodiments incorporating the principles of the present invention are shown by way of illustrative examples.

DETAILED DESCRIPTION OF THE PREFERRED EMBODIMENTS

Figure 1:
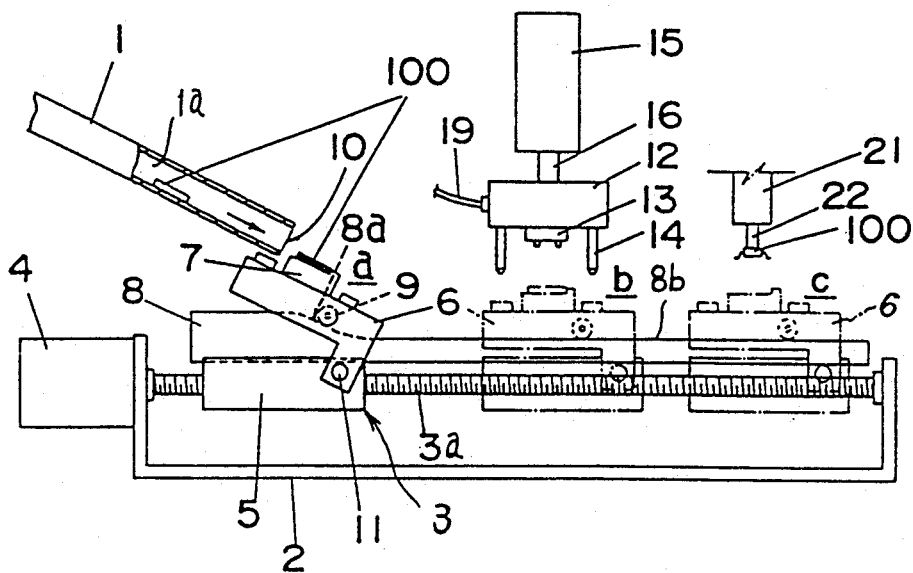
FIG. 1 is a diagrammatical side view of an electronic component supplying apparatus according to an embodiment of the present invention.

The present invention will be described in greater detail with reference to certain preferred embodiments shown in the accompanying drawings in which like reference characters designate like or corresponding parts throughout the several views.

FIG. 1 diagrammatically shows in side view an electronic component supplying apparatus according to a first embodiment of the present invention. The electronic component supplying apparatus includes a tube-shaped chute 1 provided as an electronic component supply unit. The chute 1 has a longitudinal guide track 1a and is inclined so that an electronic component 100 having a frame-shaped lead guard 103 shown in FIG. 4 slides down in and along the guide track 1a of the chute 1. The chute 1 is similar to such a chute which is incorporated in an electronic component supplying apparatus generally known as a tube feeder. The chute 1 serving as an electronic component supply unit may be replaced by a tape feeder.

The electronic component supplying apparatus includes a frame 2 on which a horizontal ball screw 3 is mounted. The ball screw 3 has a construction known per se and includes a screw shaft 3a rotatably mounted on the frame 2 and driven by a motor 4 attached to the frame 2, and a nut 5 coupled to the screw shaft 3a by ball bearings (not shown) constrained to roll in the space formed by the threads on the screw shaft 3a and the nut 5. With the ball screw 3 thus constructed, when the motor 4 is driven to rotate the screw shaft 3a, the nut 5 slides along the screw shaft 3a.

A lower mold 6 is pivotally mounted on the nut 5 by means of a pin 11. A punching die 7 is disposed on an upper surface of the lower mold 6. The lower mold 6 has a roller 9 held in rolling engagement with a cam surface of a plate cam 8. The plate cam 8 is attached to the frame 2 and extends alongside the ball screw 3 for changing the posture of the lower mold 6 in a manner described later.

With this arrangement, when the motor 4 rotates in a reverse direction, the nut 5 moves leftward in FIG. 1 so that the roller 9 goes up an oblique cam surface portion 8a of the plate cam 8. The leftward movement of the nut 5 is stopped when the lower mold 6 is disposed in a receiving position a in which the lower mold 6 is disposed below a discharging portion (lower end) 10 of the chute 1 and inclines at the same angle as the chute 1 so as to ensure that the electronic component 100 discharged from the chute 1 is reliably delivered onto the die 7. The lower mold 6 is normally disposed in the receiving position a. When the motor 4 rotates in a forward direction, the nut 5 moves rightward in FIG. 1 so that the roller 9 goes down the oblique cam surface portion 8a and subsequently moves rightward along a horizontal cam surface portion 8b of the plate cam 8. With this movement of the roller 9, the lower mold 6 changes its posture from the inclined condition by the solid lines in FIG. 1 to a horizontal condition indicated by the phantom lines in FIG. 1. The rightward movement of the nut 5 is stopped each time the lower mold 6 arrives at a punching position b and a picking-up position c. The motor-driven ball screw 3 constitutes a lower-mold conveying means or unit.

Figure 2A:
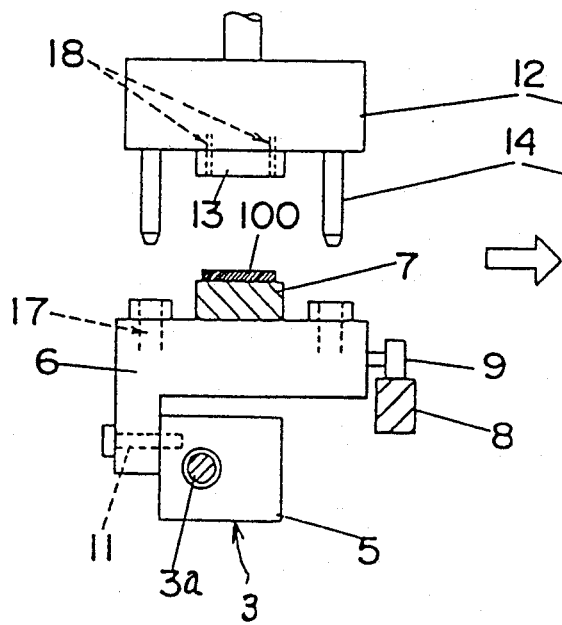
FIGS. 2A and 2B are schematic front elevational views showing the operation of an upper mold and a lower mold of the electronic component supplying apparatus.

An upper mold 12 is disposed above the punching position b. The upper mold 12 cooperates with the lower mold 6 to perform a punching operation described below while the lower mold 6 is at rest in the punching position b. The upper mold 12 includes a punch 13 attached to a lower surface of the upper mold 12, and a plurality of guide pins 14 projecting from the lower surface of the upper mold 12. The guide pins 14 are receivable in guide holes 17 (FIG. 2A) formed in the lower mold 6, so as to ensure that the punch 13 and the die 7 are held in registry with each other. The upper mold 12 is attached to a piston rod 16 of a cylinder actuator 15 disposed vertically so that in response to the operation of the cylinder actuator 15, the upper mold 12 is vertically movable toward and away from the lower mold 6 while the lower mold 6 is disposed in the punching position b. As shown in FIG. 2A, the upper mold 12 has a lead-guard holding means which comprises a plurality of suction holes 18 opening at one end to a lower surface of the punch 13 for temporarily holding the lead guard 103 cut off from the body 101 (FIG. 4) of the electronic component 100. The suction holes 18 extend through the punch 13 and the upper mold 12 and are connected at the opposite end to a suction tube 19 which in turn is connected to a vacuum source such as a suction pump (not shown). The operation of the vacuum source is stopped whereupon a suction force acting on the lower surface of the punch 13 disappears so that the lead guard 103 is released from the punch 13 and allowed to fall into a stocker 20 (FIG. 2B) disposed below the punching position b.

Figure 3A:
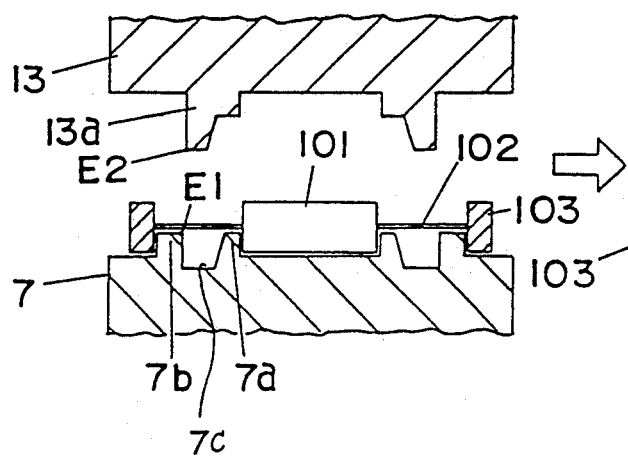
FIGS. 3A and 3B are fragmentary cross-sectional views illustrating the manner in which a lead guard is cut off from the body of an electronic component by the upper and lower molds.

FIG. 3A shows structural details of the die 7 and the punch 13. The die 7 has, on its upper surface, an inner guide projection 7a defining a central recess receptive of the body 101 of the electronic component 100 (FIG. 4), and an outer guide projection 7b extending around the inner guide projection 7a, with an annular recess 7c defined between the inner guide projection 7a and the outer guide projection 7b. The inner and outer guide projections 7a and 7b horizontally support the leads 102 of the electronic component 100 when the electronic component 100 is disposed on the die 7. The punch 13 has a punch blade 13a projecting from a lower end of the punch 13 and having a shape substantially complementary in contour to the shape of the recess 7c. When the cylinder actuator 15 (FIG. 1) is driven to lower the upper mold 12, the punch blade 13a moves into the recess 7c. With this downward movement of the punch blade 13a, a cutting edge E2 of the punch 13 and a cutting edge E1 of the outer guide projection 7b of the die 7 shear or cut off the lead guard 103 from the leads 102. The leads 102 are bent into a generally L shape when the punch blade 13a is received in the recess 7c.

Referring back to FIG. 1, there is shown a mounting head 21 disposed above the picking-up position c of the electronic component supplying apparatus. The mounting head 21 constitutes a part of an electronic component mounting machine (not shown) and has a vacuum nozzle 22 for holding the electronic component 100 by the action of a suction force. The mounting head 21 is movable between the picking-up position c in which the electronic component 100 is picked up from the lower mold 6 by means of the vacuum nozzle 22, and a mounting position (not shown) in which the electronic component 100 held on the mounting head 21 is mounted on an circuit board (not shown) set in the electronic component mounting machine. The mounting head 21 is normally disposed above the picking-up position c.

The electronic component supplying apparatus of the foregoing construction operates as follows. The operation begins with parts held in a condition shown in FIG. 1 in which the lower mold 6 is disposed in the receiving position a.

Figure 3B:
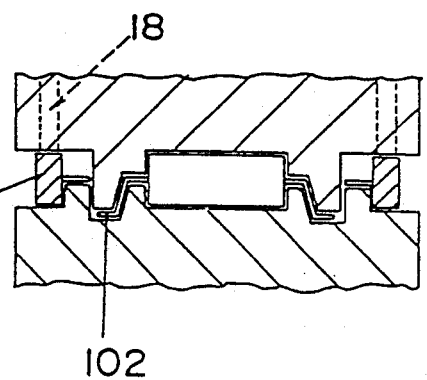
Figure 4:
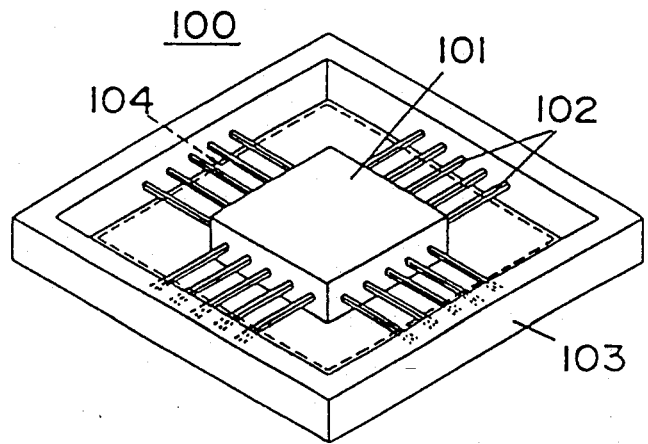
FIG. 4 is a perspective view of an electronic component to be supplied by the electronic component supplying apparatus.

An electronic component 100 having a lead guard 103 shown in FIG. 4 is supplied from the chute 1 onto the die 7 of the lower mold 6. Then, the motor 4 is driven to rotate in a forward direction so that the nut 5 moves rightward in FIG. 1 along the screw shaft 3a until the lower mold 6 moves from the receiving position a to the punching position b. During that time, the lower mold 6 changes its posture from the solid-lined inclined condition to the phantom-lined horizontal condition by the action of the plate cam 8 and the roller 9. Subsequently, the cylinder actuator 15 is driven to extend its piston rod 16, thereby lowering the upper mold 12 toward the lower mold 6. The downward movement of the upper mold 12 causes the punch blade 13a of the punch 13 to move into the recess 7c in the die 7 whereupon the leads 102 are severed at respective portions adjacent to the lead guard 103 and then bent into a generally L shape, as shown in FIG. 3B. Thus, the lead guard 103 is separated from the leads 102.

Figure 2B:
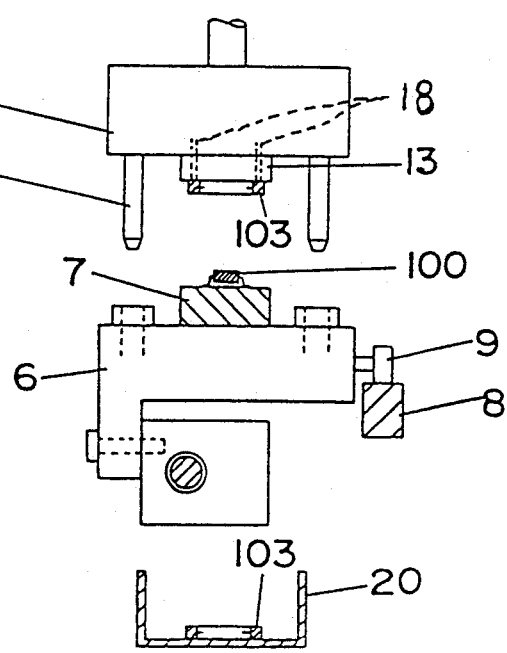

Subsequently, the cylinder actuator 15 is driven again to retract its piston rod 16 whereupon the upper mold 12 moves upward away from the lower mold 6. In this instance, the lead guard 103 is held on the lower surface of the punch 13 by the action of a suction force created in the vicinity of the suction holes 18, as shown in FIG. 2B. Then, the motor 4 is rotated again in the forward direction so that the nut 5 and the lower mold 6 connected thereto move from the punching position b toward the picking-up position c. After the departure of the lower mold 6 from the punching position b, the operation of the vacuum means (not shown) is interrupted. As a result, the suction force acting on the lead guard 104 disappears whereupon the lead guard 103 is released from the punch 13 and falls into the stocker 20 disposed below the punching position b.

When the lower mold 6 arrives at the picking-up position c, the mounting head 21 is driven to pick up from the die 7 an electronic component 100 which is devoid of the lead guard 103. The electronic component 100 thus picked up is transferred by the mounting head 21 to a mounting position disposed above a circuit board (not shown) and then mounted on the circuit board. Subsequent to the removal of the electronic component 100 from the lower mold 6, the motor 4 is rotated in the reverse direction to move the nut 5 leftward in FIG. 1 until the lower mold 6 returns from the picking-up position c to the receiving position a. A one cycle of operation of the electronic component supplying apparatus is thus completed. The aforesaid cycle of operation is repeated to supply the electronic components 100 devoid of the lead guards 103 one at a time to the transfer head 21 of the electronic component mounting machine so as to ensure that the electronic components devoid of the lead guards are mounted successively on a circuit board set in the electronic component mounting machine.

Figure 5:
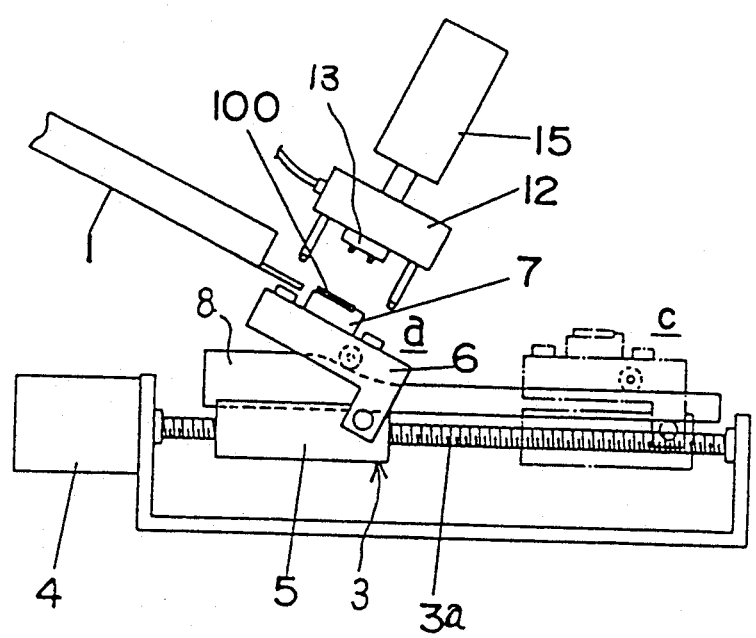
FIG. 5 is a diagrammatical side view of an electronic component supplying apparatus according to another embodiment of this invention.

FIG. 5 shows a modified form of the electronic component supplying apparatus according to the present invention. The modified apparatus includes an upper mold 12 disposed in an inclined condition above the receiving position a. The upper mold 12 tilts at an angle same as the angle of inclination of the lower mold 6 which is disposed in the receiving position a. While the lower mold 6 is disposed in the receiving position a, an electronic component 100 is delivered from the chute 1 onto a die 7 of the lower mold 6 and, subsequently, a punch 13 of the upper mold 12 is moved toward the die 7 so as cut off a lead guard 103 (FIG. 4) from the leads 102 (FIG. 4) of the electronic component 100. Thereafter, the lower mold 6 is transferred from the receiving position a to the picking-up position c. In this embodiment, the receiving position a is also used as the punching position where the lead guard 103 is cut off from a body 101 (FIG. 4) of the electronic component 100. In other words, the receiving position and the punching position are provided at the same position as a receiving-and-punching position a. A stocker (not shown but identical to the stocker 20 shown in FIG. 2B) is disposed below the receiving-and-punching position a.

Figure 6:
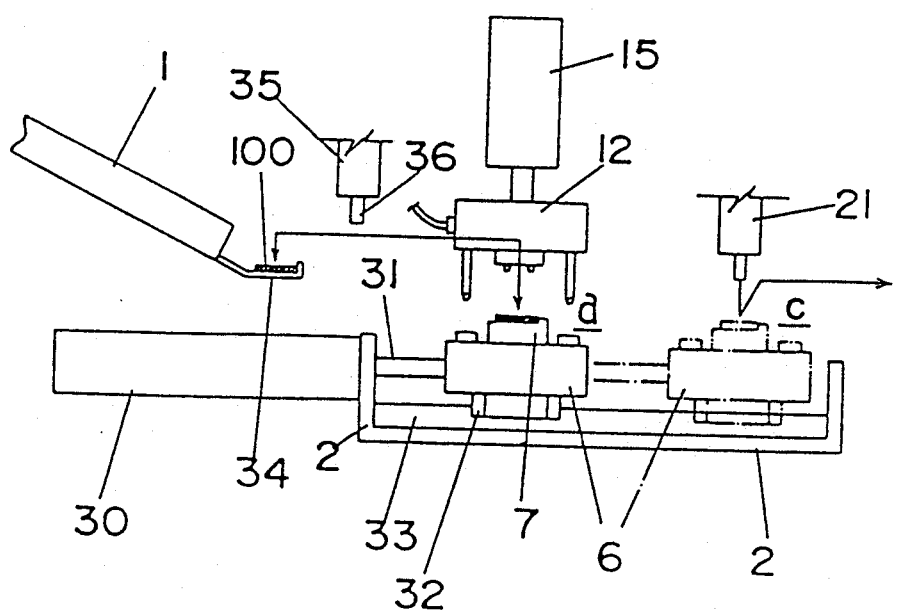
FIG. 6 is a diagrammatical side view of an electronic component supplying apparatus according to still another embodiment of this invention.

A modified electronic component supplying apparatus shown in FIG. 6 differs from the apparatus shown in FIG. 1 in that the lower-mold conveying unit is composed of a cylinder actuator 30 mounted on the frame 2 in a horizontal condition. The cylinder actuator 30 has a piston rod 31 connected to a lower mold 6. The lower mold 6 has on its lower side a slider 32 slidably mounted on a horizontal guide rail 33 which is attached to the frame 2 and extends along a path of movement of the lower mold 6. The lower mold 6 is normally disposed in the receiving-and-punching position a and is reciprocally movable between the receiving-and-punching position a and the picking-up position c. A horizontal component rest 34 is attached to the lower end of the chute 1 for receiving and temporarily holding thereon an electronic component 100 discharged from the chute 1. The electronic component 100 is transferred from the component rest 34 onto a die 7 of the lower mold 6 by means of a transfer head 35. The transfer head 35 has a vacuum nozzle 36 for holding the electronic component 100 by the action of a suction force. An upper mold 12 is disposed above the receiving-and-punching position a and vertically movable toward and away from the lower mold 6 for cutting off a lead guard 103 (FIG. 4) from the leads 102 (FIG. 4) of the electronic component 100 in the same manner as done in the first embodiment described above. After the leads 102 are separated from the lead guard 103, the cylinder actuator 30 is driven to extend its piston rod 31, thereby moving the lower mold 6 from the receiving-and-punching position a to the picking-up position c where the electronic component 100 devoid of the lead guard 103 is picked up by the mounting head 21. The electronic component 100 is then transferred by the mounting head 21 to a position above a circuit board (not shown) set in an electronic component mounting machine.

Figure 7:
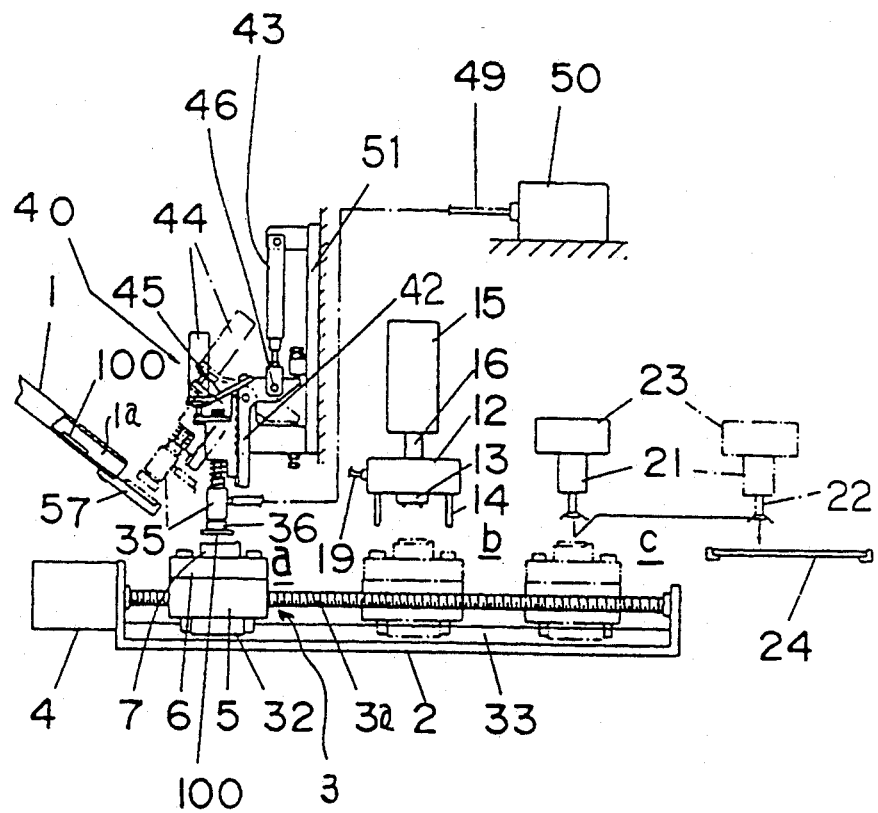
FIG. 7 is a diagrammatical side view of an electronic component supplying apparatus according to a further embodiment of the present invention.

FIG. 7 diagrammatically shows an electronic component supplying apparatus according to a still further embodiment of the present invention. The apparatus includes a frame 2 and a ball screw 3 horizontally mounted on the frame 2. The ball screw 3 is composed of a screw shaft 3a rotatably supported by the frame 2 and driven by a motor 4 attached to the frame 2, and a nut 5 threaded over the screw shaft 3a via ball bearings (not shown) constrained to roll in the space formed by the threads on the screw shaft 3a and the nut 5. The nut 5 has on its under surface a slider 32 slidably mounted on a horizontal guide rail 33 mounted on the frame 2 along the screw shaft 3a. A lower mold 6 is attached to an upper surface of the nut 5 and supports on its upper surface a die 7. With this construction, when the motor 4 is driven to rotate the screw shaft 3a, the nut 5 slides along the screw shaft 3a to reciprocate the lower mold 6 between a receiving position a, a punching position b and a picking-up position c. The lower mold 6 is normally disposed in the receiving position a. A mounting head 21 is held on a movable table 23 of an electronic component mounting machine in such a manner that when the movable table 23 is driven, the mounting head 21 is movable between the picking-up position c and a mounting position (not shown) of the electronic component mounting machine where a circuit board 24 is disposed.

Figure 8A:
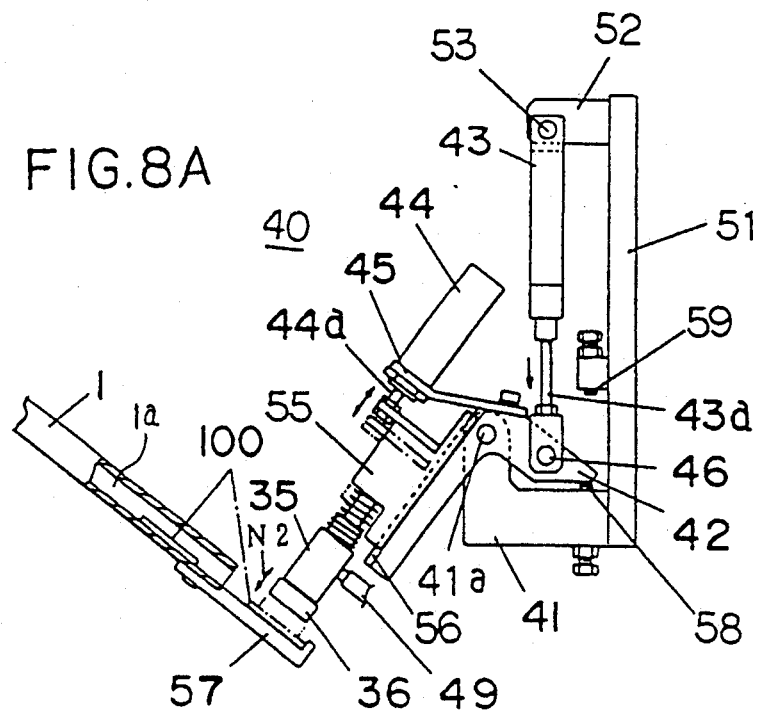
FIGS. 8A and 8B are enlarged views of a portion of FIG. 7, showing the operation of an electronic-component transfer unit.
Figure 8B:
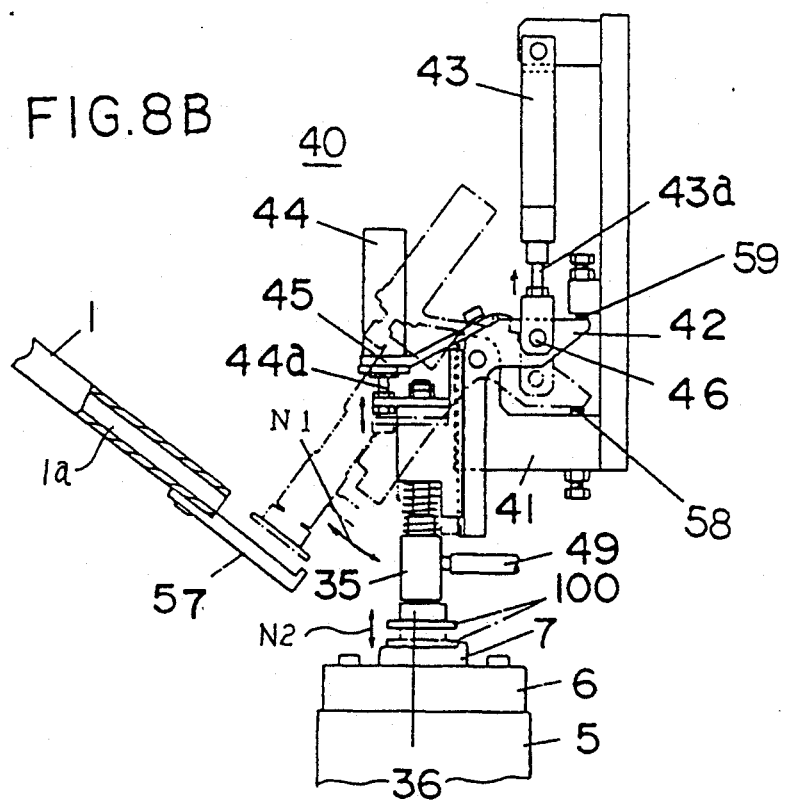

The apparatus further includes a transfer means or unit 40 disposed above the receiving position a. As shown in FIGS. 8A and 8B, the transfer unit 40 includes an L-shaped lever 42 pivotally mounted on a pin 41a secured to a first support member 41, a first cylinder actuator 43, a second cylinder actuator 44 and a transfer head 35. The support member 41 is attached to a lower end of a vertically extending elongate frame 51 of the electronic component supplying apparatus. The frame 51 is connected at its upper end to a second support member 52. The first cylinder actuator 43 is disposed a vertical inverted condition and has an upper end pivotally connected to the second support member 52 by means of a pin 53. The first cylinder actuator 43 has a piston rod 43a pivotally connected by a pin 46 to one end (right end in FIG. 8A) of the L-shaped lever 42, so that the L-shaped lever 42 is pivotally movable about the pin 41a in response to the operation of the first cylinder actuator 43. The clockwise rotation of the L-shaped lever 42 is limited by a first stopper 58 mounted on the first support member 41. The counterclockwise rotation of the L-shaped lever 42 is limited by a second stopper 59 mounted on the frame 51. The L-shaped lever 42 supports on its upper portion a L-bracket 45 on which the second cylinder actuator 44 is mounted in an inverted condition. The second cylinder actuator 44 has a piston rod 44a connected to a slide block 55 slidably mounted on a guide rail 56 secured to a longer arm of the L-shaped lever 42. The transfer head 35 is movably supported by the slide block 55. With this construction, when the first cylinder actuator 43 is driven to reciprocate its piston rod 43a, the L-shaped lever 42 turns about the pin 41a in the direction of the arrow N1 (FIG. 8B), thereby causing the transfer head 35 to move between a vertical position (releasing position) indicated by the solid lines shown in FIG. 8B and an inclined position (taking-up position) indicated by the phantom lines shown in FIG. 8B. On the other hand, when the second cylinder actuator 44 is driven to reciprocate its piston rod 44a, the slide block 55 slides along the guide rail 56, thus moving the transfer head 35 back and forth as indicated by the arrow N2.

As shown in FIG. 7, the transfer head 35 has a vacuum nozzle 36 connected by a tube 49 to a vacuum source 50 such as a suction pump. While the suction pump 50 is operating, the vacuum nozzle 36 is able to hold thereon an electronic component 100 by the action of a suction force. An inclined chute 1 has a longitudinal feed track 1a and is connected at its lower end to a component rest 57. The component rest 57 extends contiguously to the lower end of the chute 1 and has the same angle of inclination as the inclined chute 1. The electric component 1 which is discharged from the lower end of the chute 1 is received on the component rest 57.

The electronic component supplying apparatus of the foregoing construction operates as follows.

When the first cylinder actuator 43 shown in FIG. 7 is driven to extend its piston rod 43a, the L-shaped lever 42 turns clockwise about the pin 41a until it abuts against the first stopper 58. Thus, the transfer head 35 and the second cylinder actuator 44 are moved from the vertical position indicated by the solid lines to the tilted position indicated by the phantom lines shown in FIG. 7. FIG. 8A illustrates the transfer head 35 disposed in the tilted position (taking-up position). In FIG. 8A, an electronic component 100 having a lead guard 103 (FIG. 4) is retained on the component rest 57 in an inclined condition. The transfer head 35, as it is in the tilted position, is disposed in confrontation to the electronic components 100 retained on the component rest 57 and is reciprocally movable along an axis extending perpendicular to the plane of the electronic component 100. Then, the second cylinder actuator 44 is driven to extend its piston rod 44a, thus advancing the transfer head 35 advanced toward the electronic component 100. With this advancing movement of the transfer head 35, the vacuum head 36 is brought into contact with the electronic component 100. Due to a suction force created by the vacuum head 36, the electronic component 100 is held on the vacuum head 36. Thereafter, the second cylinder actuator 44 is driven again to retract its piston rod 44a whereupon the electronic component 100 held on the vacuum head 36 is picked up from the component rest 57.

Subsequently, the first cylinder actuator 43 is driven again to retract its piston rod 43a whereupon the L-shaped lever 41 turns counterclockwise about the pin 41a. The counterclockwise rotation of the L-shaped lever 41 is limited when the L-shaped lever 41 abuts against the second stopper 59. In this instance, the L-shaped lever 41 is disposed in the vertical position indicated by the solid lines shown in FIGS. 7 and 8B. Then, the second cylinder actuator 44 is driven again to extend its piston rod 44a, thereby moving the transfer head 35 vertically downward toward the die 7 on the lower mold 5. Thus, the electronic component 100 held on the vacuum head 36 is forced against the die 7. Operation of the vacuum source 50 (FIG. 7) is stopped and then the second cylinder actuator 44 is driven again to retract its piston rod 44a whereupon the transfer head 35 moves upward away from the die 7, with the electronic component 100 left on the lower die 7. Thus, the electronic component 100 is delivered to the die 7.

Then, the motor 4 shown in FIG. 7 is driven to rotate the screw shaft 3a in a direction to move the lower mold 6 from the receiving position a to the punching position b. When the lower mold 6 arrives at the punching position b, the motor 4 is stopped and then a vertically disposed cylinder actuator 15 is driven to extend its piston rod 16 for lowering the upper mold 12 toward the lower mold 6. Thus, the lead guard 103 (FIG. 4) of the electronic component 100 is cut off from the leads 102 (FIG. 4) by means of a punch 13 and the die 7 in the same manner as shown in FIGS. 3A and 3B. After the piston rod 16 of the cylinder actuator 15 is retracted, the motor 4 is driven again to advance the lower mold 6 from the punching position b to the picking-up position c. When the lower mold 6 arrives at the picking-up position c, the motor 4 is stopped and then a vacuum nozzle 22 of the mounting head 21 is lowered to pick up the electronic component 100 devoid of the lead guard 103 from the die 7 on the lower mold 6. Subsequently, the movable table 23 is driven to move the mounting head 21 to a position above the circuit board 24 and then the vacuum nozzle 22 is lowered to place the electronic component 100 onto the circuit board 24. The lead guard 103 removed from electronic component 100 at the punching position b is held on the upper mold 12 by the action of a suction force and, subsequent to the departure of the lower mold 6 from the punching position b, the lead guard 103 is released from the punch 13, falling into a stocker (not shown) disposed beneath the punching position b.

Obviously, various minor changes and modifications of the present invention are possible in the light of the above teaching. It is therefore to be understood that within the scope of the appended claims the invention may be practiced otherwise than as specifically described.

What is claimed is:

1. An apparatus for supplying an electronic component to a mounting head of an electronic component mounting machine, the electronic component having a body, a plurality of leads extending outwardly from the body, and a lead guard interconnecting front ends of the respective leads for protecting the leads against damage, said apparatus comprising:

an inclined chute having a longitudinal guide track in and along which the electronic component slides downwardly;

a component rest disposed at a lower end of said chute for receiving and temporarily holding the electronic component discharged from said chute;

a lower mold having a die;

means for moving said lower mold successively between a receiving position in which the electronic component held on said component rest is received on said die of said lower mold, a punching position in which the leads of the electronic component received on said die are severed to separate the lead guard from the body of the electronic component, and a picking-up position in which the electronic component devoid of the lead guard is picked up from said die by means of the mounting head of the electronic component mounting machine;

means for transferring the electronic component from said component rest onto said die while said lower mold is at rest in said receiving position;

an upper mold disposed above said punching position and having a punch cooperating with said die to sever the leads of the electronic component, said upper mold being vertically movable toward and away said lower mold while at rest in said punching position so that said punch and said die cooperate with each other to sever the leads of the electronic component; and means for reciprocating said upper mold relative to said lower mold.

2. An apparatus according to claim 1, further including a frame, wherein said moving means comprises a horizontal screw shaft rotatably mounted on said frame, a motor attached to said frame and coupled to said screw shaft for rotating the same, and a nut threaded over said screw shaft and movable along said screw shaft in response to rotation of said screw shaft, said nut being connected with said lower mold.

3. An apparatus according to claim 1, wherein said reciprocating means comprises a cylinder actuator having a piston rod connected to said upper mold.

4. An apparatus according to claim 1, wherein said transferring means includes a transfer head movable between a taking-up position located above said component rest and a releasing position located above said receiving position, a vacuum nozzle associated with said transfer head for releasably holding the electronic component by the action of a suction force, means for moving said transfer head between said taking-up position and said releasing position, and means for vertically moving said vacuum nozzle when said transfer head is disposed in said taking-up position and said releasing position.

5. An apparatus according to claim 4, wherein said means for moving said vacuum nozzle comprises a cylinder actuator operatively connected with said transfer head.

6. An apparatus according to claim 4, wherein said means for moving said transfer head includes a lever connected to said transfer head and pivotally movable about a pin, and means for turning said lever about said pin such that said transfer head connected to said lever moves between said taking-up position and said releasing position.

7. An apparatus according to claim 6, wherein said turning means comprises a cylinder actuator having a piston rod connected to said lever.

8. An apparatus according to claim 6, wherein said lever is connected to a bracket, and said means for moving said vacuum nozzle comprises a cylinder actuator mounted on said bracket and having a piston rod connected to said transfer head.

9. An apparatus according to claim 6, wherein said component rest extends contiguously from a lower end of said inclined chute and inclines at the same angle of inclination as said inclined chute, and wherein when said trnasfer head is disposed in said taking-up position, said vacuum nozzle reciprocates along an axis perpendicular to a plane of said component rest for taking up the electronic component from said component rest, and when said transfer head is disposed in said releasing position, said vacuum nozzle reciprocates along an axis perpendicular to a plane of said die for setting the electronic component on said die of said lower mold while at rest in said receiving position.

10. An apparatus for supplying an electronic component to a mounting head of an electronic component mounting machine, the electronic component having a body, a plurality of leads extending outwardly from the body, and a lead guard interconnecting front ends of the respective leads for protecting the leads against damage, said apparatus comprising:

an inclined chute having a longitudinal guide track in and along which the electronic component slides downwardly;

a lower mold having a die;

means for moving said lower mold between a receiving position in which the electronic component supplied from said chute is received on said die of said lower mold, a punching position in which the leads of the electronic component received on said die are severed to separate the lead guard from the body of the electronic component, and a picking-up position in which the electronic component devoid of the lead guard is picked up from said die by means of the mounting head of the electronic component mounting machine;

an upper mold disposed above said punching position and having a punch cooperating with said die to sever the leads of the electronic component, said upper mold being movable toward and away said lower mold while at rest in said punching position so that said punch and said die cooperate with each other to sever the leads of the electronic component;

means for reciprocating said upper mold relative to said lower mold; and means for causing said lower mold to tilt at an angle same as an angle of inclination of said inclined chute when said lower mold is disposed in said receiving position and also causing said lower mold to assume a horizontal condition when said lower mold is disposed in said punching position and said picking-up position.

11. An apparatus according to claim 10, further including a frame, wherein said moving means comprises a horizontal screw shaft rotatably mounted on said frame, a motor attached to said frame and coupled to said screw shaft for rotating the same, and a nut threaded over said screw shaft and movable along said screw shaft in response to rotation of said screw shaft, wherein said causing means includes a plate cam mounted on said frame and having a cam surface, and a roller mounted on said lower mold and held in rolling engagement with said cam surface, said cam surface including an inclined cam surface portion and a horizontal cam surface portion, and wherein said lower mold is pivotally connected to said nut of said moving means.

12. An apparatus according to claim 10, wherein said reciprocating means comprises a cylinder actuator having a piston rod connected to said upper mold.

13. An apparatus according to claim 12, wherein said upper mold includes vacuum means for releasably holding the lead guard by the action of a suction force after the lead guard is separated from the body of the electronic component by said punch and said die.

14. An apparatus according to claim 10, wherein said receiving position and said punching position are provided at the same position as a receiving-and-punching position, said upper mold tilts at an angle same as said angle of inclination of said chute and is reciprocally movable along an axis extending perpendicular to a plane of said die of said lower mold disposed in said receiving-and-punching position.

15. An apparatus according to claim 14, further including a frame, wherein said moving means comprises a horizontal screw shaft rotatably mounted on said frame, a motor attached to said frame and coupled to said screw shaft for rotating the same, and a nut threaded over said screw shaft and movable along said screw shaft in response to rotation of said screw shaft, wherein said causing means includes a plate cam mounted on said frame and having a cam surface, and a roller mounted on said lower mold and held in rolling engagement with said cam surface, said cam surface including an inclined cam surface portion and a horizontal cam surface portion, and wherein said lower mold is pivotally connected to said nut of said moving means.

16. An apparatus according to claim 14, wherein said reciprocating means comprises a cylinder actuator having a piston rod connected to said upper mold.

17. An apparatus according to claim 16, wherein said upper mold includes vacuum means for releasably holding the lead guard by the action of a suction force after the lead guard is separated from the body of the electronic component by said punch and said die.

18. An apparatus for supplying an electronic component to a mounting head of an electronic component mounting machine, the electronic component having a body, a plurality of leads extending outwardly from the body, and a lead guard interconnecting front ends of the respective leads for protecting the leads against damage, said apparatus comprising:

an inclined chute having a longitudinal guide track in and along which the electronic component slides downwardly;

a component rest disposed at a lower end of said chute for receiving and temporarily holding the electronic component discharged from said chute;

a lower mold having a die;

means for moving said lower mold between a receiving-and-punching position in which the electronic component held on said component rest is received on said die of said lower mold and then the leads of the electronic component received on said die are severed to separate the lead guard from the body of the electronic component, and a picking-up position in which the electronic component devoid of the lead guard is picked up from said die by means of the mounting head of the electronic component mounting machine;

means for transferring the electronic component from said component rest onto said die while said lower mold is at rest in said receiving-and-punching position;

an upper mold disposed above said receiving-and-punching position and having a punch cooperating with said die to sever the leads of the electronic component, said upper mold being vertically movable toward and away said lower mold while at rest in said receiving-and-punching position so that said punch and said die cooperate with each other to sever the leads of the electronic component; and means for reciprocating said upper mold relative to said lower mold.

19. An apparatus according to claim 18, further including a frame, wherein said moving means comprises a cylinder actuator horizontally mounted on said frame and having a piston rod connected to said lower mold.

20. An apparatus according to claim 19, further including a horizontal guide rail mounted on said frame and extending along a path of movement of said lower mold, and a slider attached to said lower mold and slidably mounted on said guide rail.

21. An apparatus according to claim 18, wherein said transferring means includes vacuum means for taking up the electronic component from said component rest and placing the electronic component onto said die.

22. An apparatus according to claim 18, wherein said reciprocating means comprises a cylinder actuator having a piston rod connected to said upper mold, and said upper mold including vacuum means for releasably holding the lead guard after it is separated from the body of the electronic component by said punch and said die.

* * * * *